(12) United States Patent
Joshi et al.

(10) Patent No.: US 8,624,357 B2
(45) Date of Patent: Jan. 7, 2014

(54) COMPOSITE SEMICONDUCTOR SUBSTRATES FOR THIN-FILM DEVICE LAYER TRANSFER

(75) Inventors: Monali B. Joshi, San Franciso, CA (US); Mark S. Goorsky, Valencia, CA (US)

(73) Assignee: The Regents of the University of California, Oakland, CA (US)

( * ) Notice: Subject to any disclaimer, the term of this patent is extended or adjusted under 35 U.S.C. 154(b) by 85 days.

(21) Appl. No.: 13/061,132

(22) PCT Filed: Aug. 27, 2009

(86) PCT No.: PCT/US2009/055146
§ 371 (c)(1),
(2), (4) Date: Jun. 1, 2011

(87) PCT Pub. No.: WO2010/025218
PCT Pub. Date: Mar. 4, 2010

(65) Prior Publication Data
US 2011/0221040 A1    Sep. 15, 2011

Related U.S. Application Data

(60) Provisional application No. 61/092,493, filed on Aug. 28, 2008.

(51) Int. Cl.
*H01L 29/06* (2006.01)
*H01L 21/30* (2006.01)
*H01L 21/46* (2006.01)

(52) U.S. Cl.
USPC .... 257/618; 438/458; 438/455; 257/E21.058; 257/E29.068

(58) Field of Classification Search
USPC ........... 257/618, E21.085, E29.068; 438/458, 438/455
See application file for complete search history.

(56) References Cited

U.S. PATENT DOCUMENTS

| 5,374,564 | A  | * | 12/1994 | Bruel          | 438/455 |
|-----------|----|---|---------|----------------|---------|
| 5,391,257 | A  |   | 2/1995  | Sullivan       |         |
| 6,100,165 | A  | * | 8/2000  | Sakaguchi et al.| 438/455 |
| 6,107,213 | A  |   | 8/2000  | Tayanaka       |         |
| 6,426,274 | B1 | * | 7/2002  | Tayanaka       | 438/458 |
| 6,767,749 | B2 |   | 7/2004  | Kub            |         |
| 6,794,276 | B2 | * | 9/2004  | Letertre et al.| 438/506 |
| 7,164,183 | B2 | * | 1/2007  | Sakaguchi et al.| 257/499 |
| 2004/0259315 | A1 | * | 12/2004 | Sakaguchi et al.| 438/285 |
| 2006/0118513 | A1 | * | 6/2006  | Faure et al.   | 216/33  |

(Continued)

OTHER PUBLICATIONS

Hopcroft_E_Si_v1p1.pdf.*

(Continued)

*Primary Examiner* — Chuong A Luu
*Assistant Examiner* — Moazzam Hossain
(74) *Attorney, Agent, or Firm* — Foley & Lardner LLP (57) ABSTRACT

Described herein are composite semiconductor substrates for use in semiconductor device fabrication and related devices and methods. In one embodiment, a composite substrate includes: (1) a bulk silicon layer; (2) a porous silicon layer adjacent to the bulk silicon layer, wherein the porous silicon layer has a Young's modulus value that is no greater than 110.5 GPa; (3) an epitaxial template layer, wherein the epitaxial template layer has a root-mean-square surface roughness value in the range of 0.2 nm to 1 nm; and (4) a set of silicon nitride layers disposed between the porous silicon layer and the epitaxial template layer.

10 Claims, 3 Drawing Sheets

(56) References Cited

U.S. PATENT DOCUMENTS

| | | |
|---|---|---|
| 2007/0281439 A1 | 12/2007 | Bedell et al. |
| 2008/0092948 A1* | 4/2008 | Chan et al. .................... 136/255 |
| 2008/0315351 A1* | 12/2008 | Kakehata ...................... 257/507 |
| 2011/0186117 A1* | 8/2011 | Kumar et al. ................. 136/256 |

OTHER PUBLICATIONS

PCT/US2009/055146, Int'l Search Report dated Mar. 11, 2010.

Joshi, et al., "L1, fabrication of transfer-enhanced substrates by wafer bonding and hydrogen exfoliation techniques." 2007 Electronic Materials Conf. (Jun. 20-22, 2007).

Joshi, et al., "II8, InGaAs/InAlAs quantum wells grown by MOVPE on transfer enhanced semiconductor substrates." 2008 Electronic Materials Conf. (Jun. 25-27, 2008).

Joshi, et al., "Fabrication of transfer-enhanced semiconductor substrates by wafer bonding and hydrogen exfoliation techniques." Electrochem. & Solid-State Lett II (8) H236-H239 (2008).

* cited by examiner

COMPOSITE SEMICONDUCTOR SUBSTRATES FOR THIN-FILM DEVICE LAYER TRANSFER

CROSS REFERENCE TO RELATED APPLICATION

This application is a National Stage Entry of PCT/US2009/055146 filed Aug. 27, 2009, which claims the benefit of U.S. Provisional Application Serial No. 61/092,493, filed on Aug. 28, 2008, the disclosure of which is incorporated herein by reference in it entirety.

STATEMENT REGARDING FEDERALLY SPONSORED RESEARCH OR DEVELOPMENT

This invention was made with Government support of Grant No. DMR-0408715, awarded by the National Science Foundation. The Government has certain rights in this invention.

FIELD OF THE INVENTION

The invention relates generally to semiconductor device fabrication and, more particularly, to composite semiconductor substrates for use in semiconductor device fabrication.

BACKGROUND

With increasing interest in thin-film devices, flexible electronics, and three-dimensional integration schemes, techniques have been developed to transfer thin-film device layers from a growth substrate with one set of characteristics desirable for growth of the device layers, such as a particular lattice parameter or a particular crystallographic orientation, to an alternate, device substrate with another set of characteristics desirable for the intended application, such as high flexibility or high thermal conductivity. Traditionally, wafer bonding and grind or etchback techniques have been used to achieve this goal. Though effective, these techniques can significantly add to resource consumption and fabrication cost, as a growth substrate can be substantially consumed as a result of grinding or etchback. Certain thin-film device layer transfer techniques, such as thin-film lift-off, can allow device layer removal while leaving a growth substrate intact for reuse. However, the resulting freestanding device layers can be difficult to manipulate for subsequent bonding to a dissimilar, device substrate. Other thin-film device layer transfer techniques, such as Cleavage of Lateral Epitaxial Films for Transfer ("CLEFT") and Electronic Layer Transfer ("ELTRAN"), exploit mechanically weak layers to facilitate device layer transfer to an alternate, device substrate. Unfortunately, these techniques can suffer from certain deficiencies that limit their applicability. In particular, device layer transfer by the CLEFT technique can be restricted to the use of growth substrates having a particular crystallographic orientation, while the ELTRAN technique can be restricted to a particular lattice parameter related to silicon homoepitaxial or pseudomorphic growth.

It is against this background that a need arose to develop the composite semiconductor substrates and related devices and methods described herein.

SUMMARY

One aspect of the invention relates to a semiconductor device fabrication method. In one embodiment, the method includes: (1) etching a silicon substrate to form a porous silicon layer adjacent to a surface of the silicon substrate, wherein the porous silicon layer has a Young's modulus value in the range of 35 percent to 65 percent of a corresponding Young's modulus value of bulk silicon; (2) forming a first silicon nitride layer adjacent to the porous silicon layer of the silicon substrate; (3) forming a second silicon nitride layer adjacent to a surface of an indium phosphide substrate; (4) bonding the first silicon nitride layer with the second silicon nitride layer to form a set of bonded substrates; and (5) separating the set of bonded substrates along an interface within the indium phosphide substrate to form a composite substrate, wherein an indium phosphide layer adjacent to the second silicon nitride layer is separated from a remainder of the indium phosphide substrate, and the composite substrate includes the indium phosphide layer.

In another embodiment, the method includes: (1) providing a first substrate including a first semiconductor material, wherein the first substrate has a first Young's modulus value; (2) forming a porous layer within the first substrate, wherein the porous layer has a second Young's modulus value in the range of 35 percent to 65 percent of the first Young's modulus value; (3) forming a first bonding layer adjacent to the porous layer of the first substrate; (4) providing a second substrate including a second semiconductor material, wherein the second semiconductor material is different from the first semiconductor material; (5) forming a second bonding layer adjacent to a surface of the second substrate; (6) implanting hydrogen ions in the second substrate; (7) bonding the first bonding layer of the first substrate with the second bonding layer of the second substrate to form a set of bonded substrates; and (8) based on the implanted hydrogen ions, exfoliating a layer of the second semiconductor material adjacent to the second bonding layer, wherein the exfoliated layer of the second semiconductor material is separated from a remainder of the second substrate so as to form a composite substrate including the exfoliated layer of the second semiconductor material.

Another aspect of the invention relates to a composite substrate for semiconductor device fabrication. In one embodiment, the composite substrate includes: (1) a bulk silicon layer; (2) a porous silicon layer adjacent to the bulk silicon layer, wherein the porous silicon layer has a Young's modulus value that is no greater than 110.5 GigaPascal ("GPa"); (3) an epitaxial template layer, wherein the epitaxial template layer has a root-mean-square surface roughness value in the range of 0.2 nanometer ("nm") to 1 nm; and (4) a set of bonding layers disposed between the porous silicon layer and the epitaxial template layer.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings.

DETAILED DESCRIPTION

Definitions

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to an object can include multiple objects unless the context clearly dictates otherwise.

As used herein, the term "set" refers to a collection of one or more objects. Thus, for example, a set of objects can include a single object or multiple objects. Objects of a set also can be referred to as members of the set. Objects of a set can be the same or different. In some instances, objects of a set can share one or more common characteristics.

As used herein, the term "adjacent" refers to being near or adjoining Adjacent objects can be spaced apart from one another or can be in actual or direct contact with one another. In some instances, adjacent objects can be coupled to one another or can be formed integrally with one another.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels or variability of the embodiments described herein.

As used herein, the terms "optional" and "optionally" mean that the subsequently described event or circumstance may or may not occur and that the description includes instances where the event or circumstance occurs and instances in which it does not.

As used herein, the term "size" refers to a characteristic dimension of an object. Thus, for example, a size of an object that is a spherical can refer to a diameter of the object. In the case of an object that is non-spherical, a size of the object can refer to an average of various orthogonal dimensions of the object. Thus, for example, a size of an object that is a spheroidal can refer to an average of a major axis and a minor axis of the object. When referring to a set of objects as having a specific size, it is contemplated that the objects can have a distribution of sizes around the specific size. Thus, as used herein, a size of a set of objects can refer to a typical size of a distribution of sizes, such as an average size, a median size, or a peak size.

Composite Semiconductor Substrates

Certain embodiments of the invention relate to a composite semiconductor substrate that is readily capable of thin-film device layer transfer to another substrate, without the constraint of a particular lattice parameter or a particular crystallographic orientation for growth of thin-film device layers. The composite substrate also can be referred as a "Transfer-Enhanced Semiconductor" substrate or a TES substrate. Application of wafer bonding and hydrogen exfoliation techniques to form the composite substrate allows dissimilar materials to be readily and effectively incorporated within the composite substrate, while maintaining a high degree of crystalline quality for epitaxial growth of thin-film device layers. In particular, the techniques described herein can be used to incorporate a thin layer of a desired epitaxial template material on a handle substrate of a dissimilar material having desired bulk characteristics. In such manner, a variety of handle substrate-epitaxial template combinations can be realized to form different heterostructures, and a lattice parameter and a crystallographic orientation of a handle substrate are no longer constraints. The incorporation of an embedded porous layer having relatively weaker mechanical characteristics adds an additional degree of freedom to a composite substrate, facilitating transfer of overlying epitaxial template and device layers by mechanical fracture through a cross-section of the composite substrate. Thus, the techniques described herein allow a variety of possibilities for heterogeneous materials integration as well as facile transfer capabilities to device substrates with more desirable characteristics for the intended application, such as high flexibility or high thermal conductivity. Furthermore, the techniques allow a significant reduction in overall cost and resource consumption for semiconductor device fabrication, since an epitaxial template substrate and a handle substrate can be reused for subsequent device layer formation and transfer operations.

Figure 1:
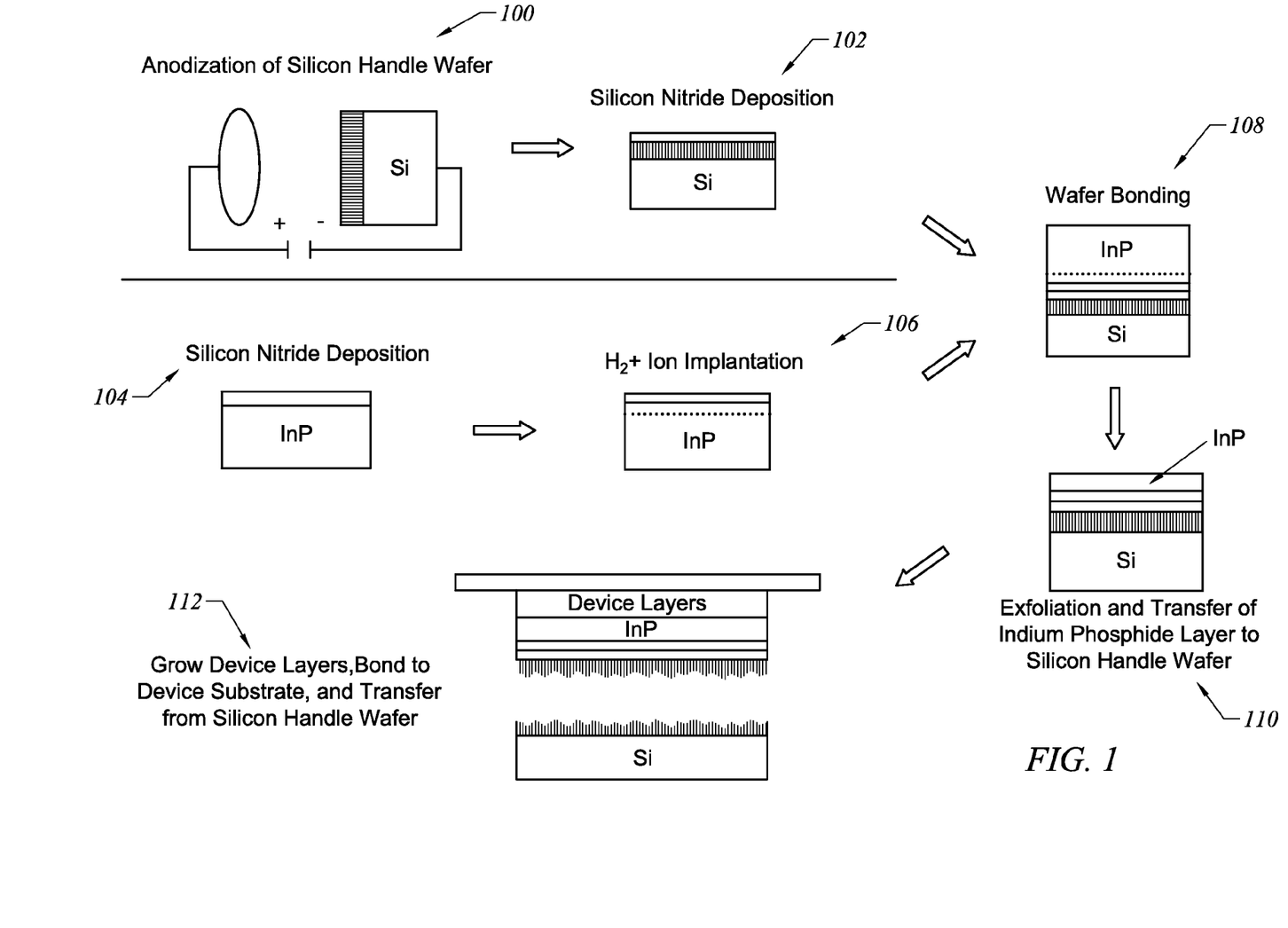
FIG. 1 illustrates a semiconductor device fabrication method, according to an embodiment of the invention.

Attention first turns to FIG. 1, which illustrates a semiconductor device fabrication method implemented in accordance with an embodiment of the invention. By way of overview, a handle substrate is provided, and is subjected to etching, thereby forming a lower-density porous layer within the handle substrate and adjacent to a surface of the handle substrate (stage 100). The porous layer is mechanically weaker, and allows subsequent transfer of overlying thin-film device layers to a device substrate. Next, an epitaxial template substrate is provided, and bonding layers are formed adjacent to respective surfaces of the handle substrate and the epitaxial template substrate (stages 102 and 104). The epitaxial template substrate, which is implanted with hydrogen ions (stage 106), is then bonded to the handle substrate via the bonding layers (stage 108). A thin layer of an epitaxial template material is transferred from the epitaxial template substrate to the handle substrate through hydrogen exfoliation (stage 110), and the transferred epitaxial template layer is subjected to further processing to achieve a surface of low roughness and high crystalline quality for epitaxial growth of a set of overlying device layers. The device layers are formed adjacent to the epitaxial template layer, and the device layers are subsequently separated from the handle substrate and transferred to an alternate, device substrate, by bonding the device layers to the device substrate and initiating mechanical fracture within the porous layer (stage 112). In such manner, the device layers are readily transferred to the device substrate, without being subjected to excessive chemical or mechanical processing that can be detrimental to the resulting semiconductor device.

Referring to stage 100 in the embodiment of FIG. 1, the handle substrate is a [001]-oriented p+-silicon wafer having a resistivity in the range of about 0.001 $\Omega$.cm to about 0.005 $\Omega$.cm, although it is contemplated that a variety of other p-type and highly re-doped silicon wafers can be used as the handle substrate. It is also contemplated that a crystallographic orientation of the silicon wafer can vary for other embodiments, and that the handle substrate, in general, can be formed of a variety of semiconductor materials, including other Group IV semiconductor materials, having desirable bulk characteristics and that are capable of being processed to form a porous layer. As illustrated in FIG. 1, the silicon wafer is subjected to anodic etching by placing the silicon wafer in an electrochemical cell with a gold wire mesh cathode and with the silicon wafer serving as an anode. Within the electrochemical cell, the silicon wafer is contacted with an electrolyte including hydrofluoric acid, deionized water, and ethanol in a substantially 1:1:2 ratio, although it is contemplated that electrolyte components and their ratios can vary for other embodiments. A surface of the silicon wafer is anodized by applying a current density in the range of about 5 mA/cm$^2$ to about 100 mA/cm$^2$, such as from about 10 mA/cm$^2$ to about 100 mA/cm$^2$, from about 5 mA/cm$^2$ to about 50 mA/cm$^2$, or about 10 mA/cm$^2$, for a time interval in the range of about 10 sec to about 10 min, such as from about 10 sec to about 5 min, from about 3 min to about 10 min, or about 5 min, thereby forming a porous silicon/silicon wafer. A doping condition of the starting silicon wafer and the anodization parameters can influence a porosity and a microstructure of the porous silicon layer and, therefore, a mechanical strength of the porous silicon layer. A thickness of the porous silicon layer can be in the range of about 0.5 micrometer ("μm") to about 10 μm, such as from about 1 μm to about 5 μm, from about 1 μm to about 3 μm, or about 2 μm.

Next, at stage 102, a bonding layer is formed by coating or covering a surface of the porous silicon layer with a silicon nitride layer having a thickness in the range of about 10 nm to about 100 nm, such as from about 10 nm to about 80 nm, from about 30 nm to about 80 nm, or about 50 nm. The silicon nitride layer can have a chemical composition represented as $Si_3N_4$, and formation of the silicon nitride layer adjacent to the porous silicon layer can be carried out by Plasma Enhanced Chemical Vapor Deposition ("PECVD") or another suitable deposition technique. It is contemplated that a variety of other materials can be used in place of, or in combination with, silicon nitride to serve as the bonding layer, including other ceramic materials having desirable bonding and conformal coating characteristics.

Referring to stage 104 in the embodiment of FIG. 1, the epitaxial template substrate is a [001]-oriented, semi-insulating indium phosphide wafer. It is contemplated that a crystallographic orientation of the indium phosphide wafer can vary for other embodiments, and that the epitaxial template substrate, in general, can be formed of a variety of semiconductor materials, including other Group III-V semiconductor materials in the form of binary, ternary, quaternary, and quinary alloys, having desirable lattice parameters or desirable crystallographic orientations for growth of thin-film device layers. As illustrated in FIG. 1, a bonding layer is formed by coating or covering a surface of the indium phosphide wafer with a silicon nitride layer having a thickness in the range of about 10 nm to about 100 nm, such as from about 30 nm to about 100 nm, from about 50 nm to about 100 nm, or about 80 nm. The silicon nitride layer can have a chemical composition represented as $Si_3N_4$, and formation of the silicon nitride layer adjacent to the indium phosphide wafer can be carried out by sputter coating or another suitable deposition technique. It is contemplated that a variety of other materials can be used in place of, or in combination with, silicon nitride to serve as the bonding layer, including other ceramic materials having desirable bonding and conformal coating characteristics.

After sputter coating with silicon nitride, the indium phosphide wafer is outgassed in a Rapid Thermal Anneal furnace at a temperature in the range of about 400° C. to about 600° C., such as from about 450° C. to about 550° C. or about 500° C., for a time interval in the range of about 10 sec to about 5 min, such as from about 30 sec to about 2 min or about 1 min. Next, at stage 106, the indium phosphide wafer is implanted with hydrogen ions in the form of $H_2$ at a dose level in the range of about $1\times10^{16}$/cm$^2$ to about $1\times10^{17}$/cm$^2$, such as from about $3\times10^{16}$/cm$^2$ to about $8\times10^{16}$/cm$^2$ or about $5\times10^{16}$/cm$^2$, while cooled at a temperature below about 0° C., such as about −20° C.

Referring to stage 108 in the embodiment of FIG. 1, the indium phosphide wafer and the porous silicon/silicon wafer are subjected to oxygen plasma activation at an oxygen pressure in the range of about 50 millitorr ("mtorr") to about 300 mtorr, such as from about 100 mtorr to about 300 mtorr or about 200 mtorr, at a power level in the range of about 50 Watts ("W") to about 300 W, such as from about 100 W to about 300 W or about 200 W, and for a time interval in the range of about 10 sec to about 5 min, such as from about 30 sec to about 2 min or about 1 min. The wafers are rinsed with deionized water and nitrogen-dried, and surfaces of their respective silicon nitride layers are aligned so as to face each other and are bonded at or near room temperature.

Next, at stage 110, the bonded wafers are subjected to multi-stage annealing, with each annealing stage carried out at a temperature $T_i$ for a time interval and i=1, . . . n, where n≥2. In particular, the bonded wafers are initially annealed at a temperature in the range of about 50° C. to about 250° C., such as from about 100° C. to about 200° C., from about 120° C. to about 180° C., or about 150° C., for a time interval in the range of about 1 hr to about 10 hr, such as from about 2 hr to about 10 hr, from about 5 hr to about 10 hr, or about 8 hr, thereby strengthening the bonding and promoting diffusion of hydrogen ions to defects in the indium phosphide wafer. This initial annealing stage is followed by another annealing stage at a temperature in the range of about 200° C. to about 400° C., such as from about 250° C. to about 350° C., from about 270° C. to about 330° C., or about 300° C., for a time interval in the range of about 5 sec to about 30 min, such as from about 5 sec to about 20 min or from about 1 min to about 20 min, thereby further strengthening the bonding, inducing exfoliation and transfer of an indium phosphide layer onto the porous silicon/silicon wafer, and removing residual implanted hydrogen ions. The wafer bonding and exfoliation parameters can influence characteristics of the indium phosphide layer that is separated from the indium phosphide wafer and transferred onto the porous silicon/silicon wafer. For example, insufficient annealing time can result in insufficient "healing" of the transferred indium phosphide layer and adversely affect its crystalline quality. After annealing, the transferred indium phosphide layer is subjected to chemical mechanical polishing to further remove implantation damage and planarize its surface. It is contemplated that another surface planarization technique can be used in place of, or in combination with, chemical mechanical polishing. After polishing, a thickness of the transferred indium phosphide layer can be in the range of about 0.05 μm to about 1 μm, such as from about 0.2 μm to about 0.5 μm, from about 0.2 μm to about 0.4 μm, or about 0.3 μm.

Using the above-described fabrication parameters, a composite semiconductor substrate can be formed using the porous silicon/silicon wafer and the transferred indium phosphide layer, which serves as a template for epitaxial growth of thin-film device layers in stage 112. The transferred indium phosphide layer can be characterized in accordance with conventional techniques, such as Atomic Force Microscopy ("AFM"), Cross-Sectional Transmission Electron Microscopy ("XTEM"), and High-Resolution X-ray Diffraction ("HRXRD"). For example, AFM can be used to characterize a surface roughness of the transferred indium phosphide layer in terms of an extent of variation of surface heights, such as in accordance with a root-mean-square ("rms") value, while HRXRD can be used to characterize its crystalline quality in terms of a spectral width of a triple-axis X-ray rocking curve, such as in accordance with a Full-Width-at-Half-Maximum ("FWHM") of a spectral peak. Advantageously, the transferred indium phosphide layer can be substantially planar, with a rms surface roughness value in the range of about 0.2 nm to about 1 nm, such as from about 0.3 nm to about 0.7 nm, from about 0.4 nm to about 0.6 nm, or about 0.5 nm, and can be of a high crystalline quality, with a FWHM in the range of about 25 arcsec to about 40 arcsec, such as from about 28 arcsec to about 38 arcsec, from about 28 arcsec to about 34 arcsec, or about 31 arcsec.

Figure 2:
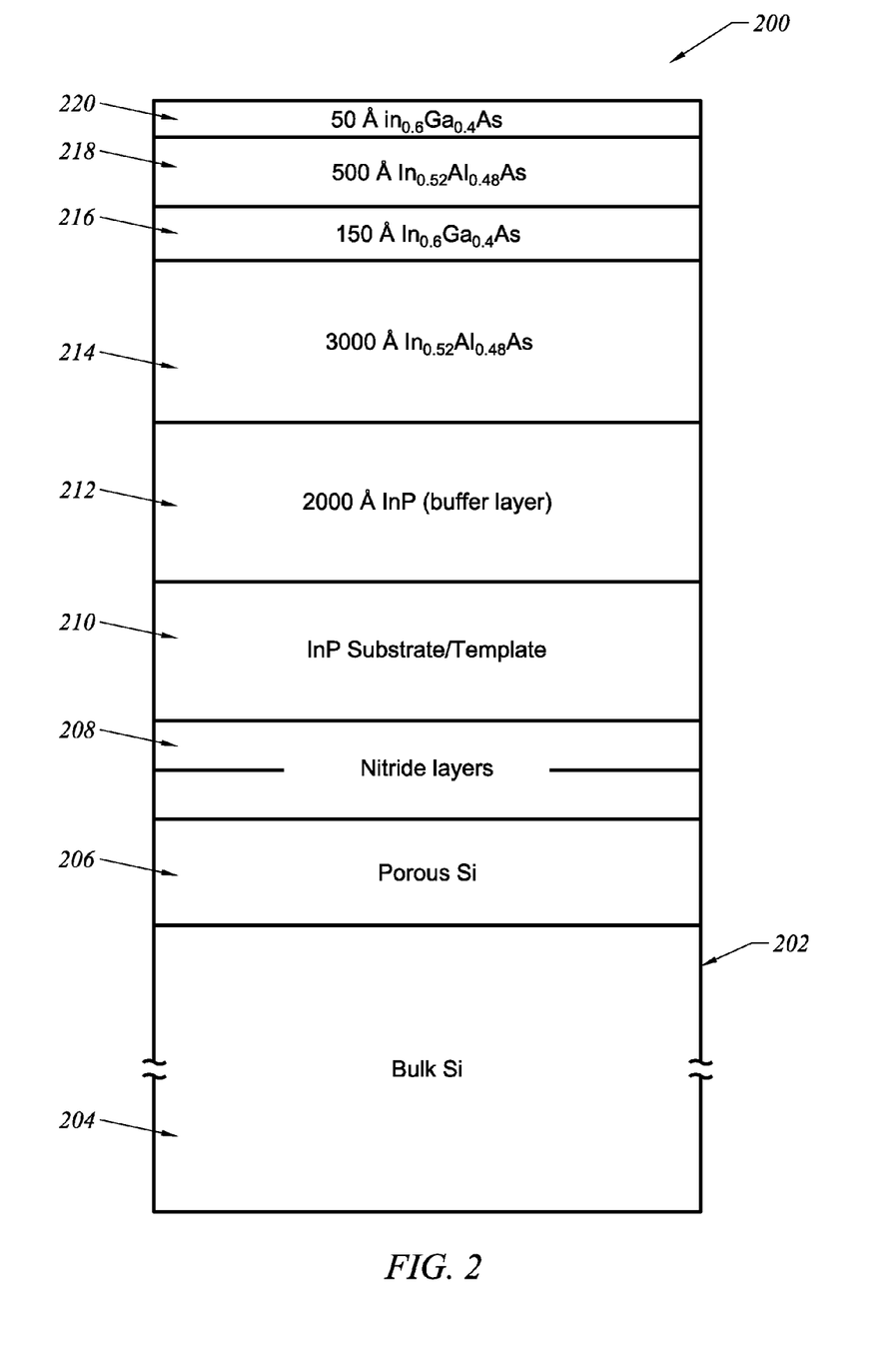
FIG. 2 illustrates an assembly of thin-film device layers that can be formed using the method of FIG. 1, according to an embodiment of the invention.

One of a variety of devices that can be formed using a composite semiconductor substrate is illustrated in FIG. 2 and is described next in accordance with an embodiment of the invention. As illustrated in FIG. 2, an assembly 200 includes a composite semiconductor substrate 202, which includes a bulk silicon layer 204, a porous silicon layer 206 adjacent to the bulk silicon layer 204, an indium phosphide layer 210, and a set of silicon nitride layers 208 disposed between the porous silicon layer 206 and the indium phosphide layer 210. The indium phosphide layer 210, along with another indium phosphide layer 212, serve as a template for epitaxial growth of thin-film device layers 214, 216, 218, and 220. In the illustrated embodiment, the device layers 214, 216, 218, and 220 correspond to an indium gallium arsenide/indium aluminum arsenide quantum well structure, with respective ones of the device layers 214, 216, 218, and 220 serving as a cap layer, a barrier layer, a channel layer, and a buffer layer. Formation of the device layers 214, 216, 218, and 220 can be carried out by Metallorganic Vapor Phase Epitaxy ("MOVPE") deposition or another suitable epitaxy deposition technique.

Referring back to FIG. 1, once the thin-film device layers are formed in stage 112, surfaces of the device substrate and an upper one of the device layers are aligned so as to face each other and are bonded using a suitable bonding technique. Advantageously, separation of the indium phosphide layer and the device layers from the porous silicon/silicon wafer and their transfer onto the device substrate can be readily induced by mechanical fracture within the porous silicon layer. In the illustrated embodiment, mechanical fracture is promoted by annealing at a temperature in the range of about 300° C. to about 700° C., such as from about 400° C. to about 700° C., from about 500° C. to about 700° C., or about 600° C., for a time interval in the range of about 10 min to about 4 hr, such as from about 1 hr to about 4 hr, from about 2 hr to about 4 hr, or about 3 hr, thereby further weakening the porous silicon layer and allowing fracture to occur by insertion of a sharp object or by another suitable mechanical, sonic, or vibrational technique. Annealing of the porous silicon layer can be carried out as part of wafer bonding and exfoliation operations in stages 108 and 110, as part of device layer formation in stage 112, or both. Once the indium phosphide layer and the device layers are transferred onto the device substrate, any excess material or layer, such as any remaining porous silicon, can be removed by polishing or another suitable removal technique.

Figure 3:
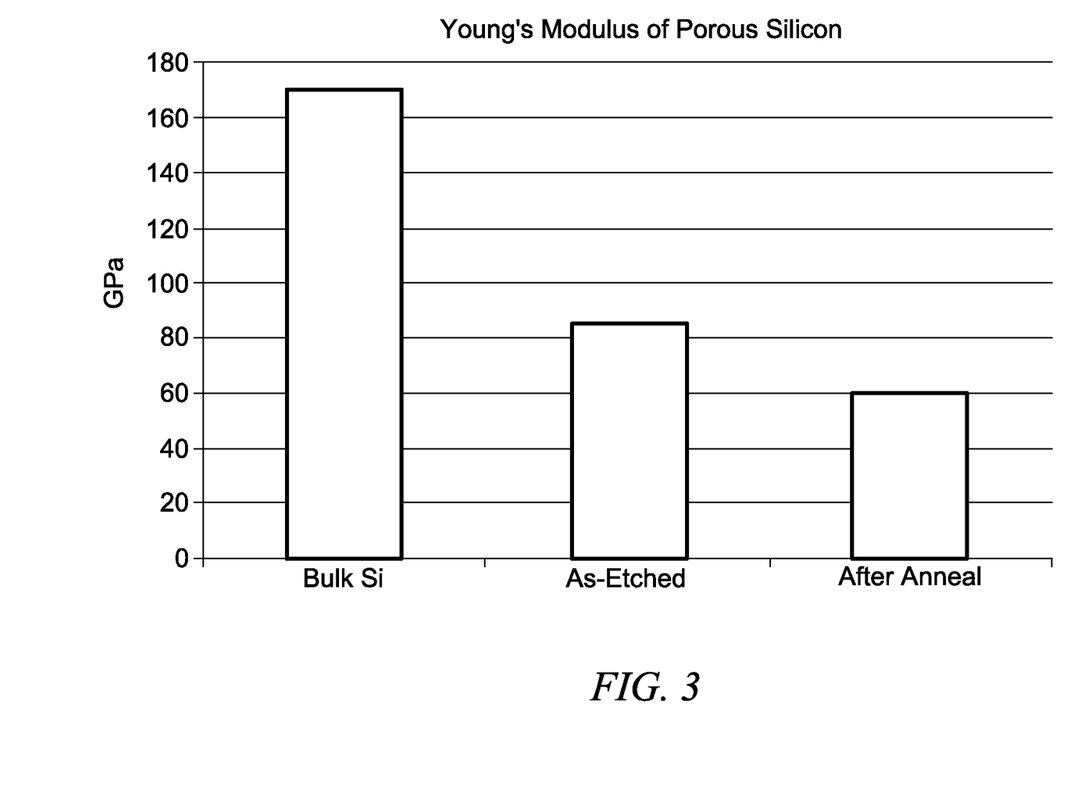
FIG. 3 illustrates Young's modulus values of bulk silicon, porous silicon prior to annealing, and porous silicon after annealing, according to an embodiment of the invention.

Mechanical characteristics of the porous silicon layer can influence device layer transfer capabilities in at least two ways. First, the porous silicon layer desirably has sufficient strength to withstand wafer bonding and exfoliation operations as well as chemical mechanical polishing of the indium phosphide layer. Second, after formation of the device layers, the porous silicon layer desirably is sufficiently weak to facilitate transfer of the indium phosphide layer and the device layers onto the device substrate. Weakening of the porous silicon layer can be evidenced by a reduction in a Young's modulus value of the porous silicon layer after annealing, relative to corresponding Young's modulus values of bulk silicon and of the porous silicon layer prior to annealing. As illustrated in FIG. 3, bulk silicon typically has a Young's modulus value of about 170 GPa, while the porous silicon layer, in an "as-etched" condition prior to annealing, can have a Young's modulus value in the range of about 35 percent to about 65 percent of the corresponding value for bulk silicon (or in the range of about 59.5 GPa to about 110.5 GPa), such as from about 45 percent to about 55 percent (or from about 76.5 GPa to about 93.5 GPa), from about 47 percent to about 53 percent (or from about 79.9 GPa to about 90.1 GPa), or about 50 percent (or about 85 GPa). In contrast, the porous silicon layer, as further weakened by annealing, can have a Young's modulus value in the range of about 15 percent to about 45 percent of the corresponding value for bulk silicon (or in the range of about 25.5 GPa to about 76.5 GPa), such as from about 25 percent to about 40 percent (or from about 42.5 GPa to about 68 GPa), from about 32 percent to about 38 percent (or from about 54.4 GPa to about 64.6 GPa), or about 35 percent (or about 60 GPa).

Alternatively, or in combination, weakening of the porous silicon layer can be correlated with a coarsening of the microstructure of the porous silicon layer, as promoted by elevated temperatures during annealing. This coarsening of the microstructure can be evidenced by an increase in porosity, an increase in pore size, or both. In some instances, the porous silicon layer, in the "as-etched" condition prior to annealing, can have an average pore size that is no greater than about 1 µm, such as from about 1 nm to about 10 nm, from about 10 nm to about 100 nm, or from about 100 nm to about 1 µm, while the porous silicon layer, as further weakened by annealing, can have an average pore size that is greater than 1 µm, such as from about 1.1 µm to about 100 µm, from about 2 µm to about 80 µm, or from about 2 µm to about 50 µm.

The techniques described herein can be exploited in the fabrication of semiconductor solar cells as well as a variety of other semiconductor devices, by allowing thin-film devices to be realized while reducing the consumption of costly starting materials. After exfoliation and device layer separation, an epitaxial template substrate and a handle substrate can be reused for subsequent device layer formation and transfer operations. The techniques can also reduce time and effort for semiconductor device fabrication, as chemical or mechanical processing to separate device layers, such as in accordance with grind or etchback techniques, can be circumvented by facile fracture through a porous layer. The techniques can be extended to a variety of semiconductor material combinations to form transfer-ready composite substrates for the fabrication of indium phosphide-based devices and other Group III-V-based devices as well as other types of semiconductor devices. Once device layers are separated from a handle substrate, those layers can be incorporated in a variety of applications, such as flexible electronics and complex three-dimensional device architectures that would be otherwise difficult and costly to fabricate.

EXAMPLE

The following example describes specific aspects of an embodiment of the invention to illustrate and provide a description for those of ordinary skill in the art. The example should not be construed as limiting the invention, as the example merely provides specific methodology useful in understanding and practicing an embodiment of the invention.

Experimental

[001]-oriented p$^+$-silicon handle wafers (0.001-0.005 Ω.cm resistivity) were placed in an electrochemical cell with a gold wire mesh cathode in an electrolyte including hydrofluoric acid, deionized water, and ethanol in a 1:1:2 ratio. A current density of 10 mA/cm$^2$ was applied for 5 min to anodize surfaces of the silicon wafers. The resulting porous surfaces were then covered with a 50 nm silicon nitride bonding layer by plasma enhanced chemical vapor deposition. Next, [001]-oriented, semi-insulating indium phosphide template wafers were sputter-coated with a 80 nm silicon nitride bonding layer and outgassed in a rapid thermal anneal furnace at 500° C. for 1 min. The indium phosphide wafers were subsequently implanted with a $H_2^+$ dose of $5\times10^{16}$/cm$^2$ at 150 keV while being cooled at −20° C. The indium phosphide wafers and silicon wafers were then subjected to 1 min oxygen plasma activation at an oxygen pressure of 200 mTorr and a power of 200 W. The wafers were rinsed with deionized water and nitrogen-dried, and the silicon nitride surfaces were bonded at room temperature. The resulting bonded wafers were annealed at 150° C. for 8 hr to strengthen the bonding and promote hydrogen diffusion to defects in the indium phosphide wafers, followed by a second anneal at 300° C. to strengthen the bonding, induce exfoliation of an indium phosphide layer, and remove residual implanted hydrogen. The exfoliated indium phosphide layer was then subjected to chemical mechanical polishing to reduce implantation damage and planarize its surface. A comparison structure was formed by transferring an indium phosphide layer to a silicon handle wafer that did not include a porous layer. Surface roughness was assessed using AFM (Ambios Technology). Bede D$^3$ and Maxflux D$^1$ diffractometers were used for triple-axis X-ray rocking curves and reciprocal space maps. A JEOL 2000 FX electron microscope was used to obtain XTEM images.

Results

AFM images of a porous silicon surface were analyzed after etching. The porous silicon surface was smooth, with a rms surface roughness of 0.4 nm that is comparable to that of a pristine polished silicon wafer. After deposition of a silicon nitride layer on the porous silicon surface, the surface morphology was assessed, and a rms surface roughness was measured to be 0.6 nm. The low roughness of the silicon nitride surface indicated that the deposition of the silicon nitride layer was conformal on the smooth, porous silicon surface, and no additional surface planarization operation was required for subsequent wafer bonding.

After wafer bonding and exfoliation of an indium phosphide layer onto a handle wafer, a chemical mechanical polishing operation was employed to improve the surface morphology and crystalline quality of the indium phosphide layer. Prior to polishing, the rms surface roughness of the indium phosphide surface was measured to be 2.9 nm. After polishing, the surface roughness improved to a rms value of 0.5 nm. In addition to planarizing the surface, the chemical mechanical polishing operation substantially removed any crystalline damage remaining at the surface of the indium phosphide layer due to the exfoliation operation. Triple-axis rocking curve measurements of the indium phosphide layer were made before and after polishing. In the as-exfoliated condition, the indium phosphide layer exhibited a peak with a FWHM of 39 arcsec, while the layer after polishing exhibited a peak with a FWHM of 31 arcsec. Improvement in surface quality was apparent in the reduction of diffuse scattering. The measured Full-Width-at-One-Thousandth-the-Maximum ("FW0.001M") was 178 arcsec in the as-exfoliated condition, which improved upon polishing to 129 arcsec. The decrease in diffracted intensity observed (>30 percent) is likely attributed to the loss of material after polishing. About 0.2 μm of material was removed during polishing, or about 40 percent of the transferred indium phosphide layer thickness. A bright-field transmission electron microscopy image of the resulting composite substrate was analyzed after polishing. The indium phosphide layer was observed to be highly planar, with no visible defects at the surface from polishing. The indium phosphide layer measured about 0.3 μm in thickness, and the porous silicon layer thickness was about 2.3 μm.

Triple axis reciprocal space maps of indium phosphide layers transferred to different handle wafers were analyzed. In particular, an indium phosphide layer was transferred to a silicon handle wafer including a porous silicon layer, and a reciprocal space map was analyzed for indium phosphide [004] reflection. The indium phosphide layer exhibited a tensile strain with respect to relaxed indium phosphide of 0.25 percent. In order to assess any impact the porous layer may have on the strain state of the indium phosphide layer, a comparison structure, which included an indium phosphide layer transferred to a bare silicon handle wafer, was similarly formed and characterized. The [004] reciprocal space map for the comparison structure indicated a measured tensile strain of 0.20 percent. Though residual strain observed in the indium phosphide layer on the porous silicon/silicon handle wafer was greater than on the bare silicon wafer (with an angular separation between indium phosphide layer peaks of 59 arcsec in the [001] direction), the similarity in magnitude of the measured strains indicates that the porous layer does not significantly enhance compliance of the resulting composite substrate.

Results also indicate that transfer of epitaxial layers from a resulting composite substrate can be readily induced through a porous silicon layer. A test structure including a silicon wafer bonded to a porous silicon/silicon handle wafer with silicon nitride interlayers was formed and annealed at 600° C. for 3 hr to mimic MOVPE deposition conditions. Before heat treatment, the test structure was mechanically rigid, and fracture could not be induced by razor blade insertion through the porous silicon layer. However, after heat treatment, the test structure remained intact until a razor blade was inserted, and separation of the silicon wafer from the handle wafer propagated through the porous silicon layer, as evidenced by the presence of porous material on surfaces of both of the separated wafers.

A practitioner of ordinary skill in the art requires no additional explanation in developing the techniques described herein but may nevertheless find some helpful guidance regarding wafer bonding and chemical mechanical polishing by examining the following references: Hayashi et al., "Materials Issues for the Heterogeneous Integration of III-V Compounds: Exfoliation and Layer Transfer," *Journal of The Electrochemical Society*, 153 (12) G101 1-G1014 (2006) and Hayashi et al., "Processing Issues For Wafer Bonded III-V On Insulator Structures," *IEEE International Conference On Indium Phosphide And Related Materials*, pp. 358-361 (2004), the disclosures of which are incorporated herein by reference in their entireties.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor device fabrication method, comprising:
    providing a first substrate including a first semiconductor material, wherein the first substrate has a first Young's modulus value;
    forming a porous layer within the first substrate, wherein the porous layer has a second Young's modulus value in the range of 35 percent to 65 percent of the first Young's modulus value;
    forming a first bonding layer adjacent to the porous layer of the first substrate;
    providing a second substrate including a second semiconductor material, wherein the second semiconductor material is different from the first semiconductor material;
    forming a second bonding layer adjacent to a surface of the second substrate;
    implanting hydrogen ions in the second substrate;
    bonding the first bonding layer of the first substrate with the second bonding layer of the second substrate to form a set of bonded substrates; and
    based on the implanted hydrogen ions, exfoliating a layer of the second semiconductor material adjacent to the second bonding layer, wherein the exfoliated layer of the second semiconductor material is separated from a remainder of the second substrate so as to form a composite substrate including the exfoliated layer of the second semiconductor material, wherein the set of bonded substrates is a first set of bonded substrates, and further comprising:
    forming a device layer adjacent to the exfoliated layer of the second semiconductor material;
    bonding the device layer with a device substrate to form a second set of bonded substrates; and
    separating the second set of bonded substrates along an interface within the porous layer to form a semiconductor device, wherein the semiconductor device includes the device substrate and the device layer bonded to the device substrate.

2. The semiconductor device fabrication method of claim 1, wherein the first semiconductor material is a Group IV semiconductor material, and the second semiconductor material is a Group III-V semiconductor material.

3. The semiconductor device fabrication method of claim 2, wherein the first semiconductor material is silicon, the second semiconductor material is indium phosphide, the first bonding layer is a first silicon nitride layer, and the second bonding layer is a second silicon nitride layer.

4. The semiconductor device fabrication method of claim 2, wherein the first substrate is a p+-type silicon substrate.

5. The semiconductor device fabrication method of claim 4, wherein forming the porous layer includes subjecting the p+-type silicon substrate to anodic etching based on a current density in the range of 10 mA/cm$^2$ to 100 mA/cm$^2$, an anodization time interval in the range of 10 seconds to 5 minutes, and an electrolyte including hydrofluoric acid, deionized water, and ethanol.

6. The semiconductor device fabrication method of claim 2, wherein exfoliating the layer of the second semiconductor material includes:
    annealing the first set of bonded substrates at a first temperature $T_1$ for a first time interval $t_1$; and
    annealing the first set of bonded substrates at a second temperature $T_2$ for a second time interval $t_2$,
    wherein $T_1 < T_2$ and $t_1 > t_2$.

7. The semiconductor device fabrication method of claim 6, wherein $T_1$ is in the range of 100° C. to 200° C., $t_1$ is in the range of 1 hr to 10 hr, $T_2$ is in the range of 250° C. to 350° C., and $t_2$ is in the range of 5 sec to 30 min.

8. The semiconductor device fabrication method of claim 5, wherein the hydrofluoric acid, the deionized water, and the ethanol are substantially in a 1:1:2 ratio.

9. The semiconductor device fabrication method of claim 1, wherein the second Young's modulus value is in the range of 45 percent to 55 percent of the first Young's modulus value.

10. The semiconductor device fabrication method of claim 1, further comprising subjecting the exfoliated layer of the second semiconductor material to chemical mechanical polishing to form a substantially planar surface.

* * * * *